United States Patent
Koyama

(10) Patent No.: US 10,326,029 B2
(45) Date of Patent: Jun. 18, 2019

(54) SEMICONDUCTOR DEVICE INCLUDING AN ULTRAVIOLET LIGHT RECEIVING ELEMENT AND METHOD OF MANUFACTURING THE SAME

(71) Applicant: ABLIC Inc., Chiba-shi, Chiba (JP)

(72) Inventor: Takeshi Koyama, Chiba (JP)

(73) Assignee: ABLIC INC., Chiba (JP)

(*) Notice: Subject to any disclaimer, the term of this patent is extended or adjusted under 35 U.S.C. 154(b) by 0 days.

(21) Appl. No.: 15/928,433

(22) Filed: Mar. 22, 2018

(65) Prior Publication Data

US 2018/0277690 A1    Sep. 27, 2018

(30) Foreign Application Priority Data

Mar. 24, 2017 (JP) ................... 2017-059971

(51) Int. Cl.
| | |
|---|---|
| H01L 27/146 | (2006.01) |
| H01L 31/0216 | (2014.01) |
| H01L 27/144 | (2006.01) |
| H01L 31/18 | (2006.01) |
| H01L 31/103 | (2006.01) |
| H01L 31/0352 | (2006.01) |

(52) U.S. Cl.
CPC .... H01L 31/02165 (2013.01); H01L 27/1443 (2013.01); H01L 31/02162 (2013.01); H01L 31/035272 (2013.01); H01L 31/103 (2013.01); H01L 31/1804 (2013.01)

(58) Field of Classification Search
CPC .................... H01L 27/14623; H01L 27/14643
USPC ............................................. 257/432; 438/69
See application file for complete search history.

(56) References Cited

U.S. PATENT DOCUMENTS

| | | | | |
|---|---|---|---|---|
| 5,945,722 A | * | 8/1999 | Tsuei ................ | H01L 27/14621 257/232 |
| 6,133,615 A | * | 10/2000 | Guckel ............ | H01L 27/14601 257/292 |
| 2005/0103983 A1 | * | 5/2005 | Yamaguchi ....... | H01L 27/14621 250/214.1 |
| 2008/0237763 A1 | | 10/2008 | Miura et al. | |
| 2012/0241825 A1 | * | 9/2012 | Aichi ................... | G02F 1/1368 257/290 |
| 2015/0048239 A1 | * | 2/2015 | Tominaga ............. | G02B 1/116 250/208.1 |

FOREIGN PATENT DOCUMENTS

| | | |
|---|---|---|
| JP | H05-341122 A | 12/1993 |
| JP | 2008-251709 A | 10/2008 |
| JP | 2016-11142 A | 6/2016 |

* cited by examiner

*Primary Examiner* — George R Fourson, III
(74) *Attorney, Agent, or Firm* — Brinks Gilson & Lione

(57) ABSTRACT

First and second semiconductor light receiving elements each include: a first P-type semiconductor region which is formed in an N-type semiconductor substrate; a first N-type semiconductor layer region which is formed in the first P-type semiconductor region; a P-type semiconductor region having a high concentration which is formed in the first P-type semiconductor region; and an N-type semiconductor region having a high concentration which is formed in the first N-type semiconductor layer region. On the semiconductor substrate, insulating oxide films are formed. On the first and the second semiconductor light receiving elements, insulating oxide films that have different thicknesses are formed.

20 Claims, 5 Drawing Sheets

SEMICONDUCTOR DEVICE INCLUDING AN ULTRAVIOLET LIGHT RECEIVING ELEMENT AND METHOD OF MANUFACTURING THE SAME

RELATED APPLICATIONS

This application claims priority under 35 U.S.C. § 119 to Japanese Patent Application No. 2017-059971 filed on Mar. 24, 2017, the entire content of which is hereby incorporated by reference.

BACKGROUND OF THE INVENTION

1. Field of the Invention

The present invention relates to a semiconductor device including an ultraviolet light receiving element and a method of manufacturing the semiconductor device.

2. Description of the Related Art

In recent years, attention is paid to effects of ultraviolet light present in the sunlight and having a wavelength of 400 nm or less to the human body and the environment, and there is provided ultraviolet light information using a UV index which is an index of an amount of the ultraviolet light. The ultraviolet light is divided into UV-A (wavelength of from 315 nm to 400 nm), UV-B (wavelength of from 280 nm to 315 nm), and UV-C (wavelength of from 200 nm to 280 nm) depending on the wavelengths. The UV-A darkens skin, and causes aging. The UV-B causes inflammation of the skin, and may cause skin cancer. The UV-C is absorbed by the ozone layer, and hence does not reach the surface of the earth. However, the UV-C has strong germicidal action, and hence is utilized for germicidal lamps. Based on those backgrounds, in recent years, it has been expected that a sensor for detecting intensity of the respective ultraviolet light regions is developed.

In Japanese Patent Application Laid-open H05-341122, there is proposed a multilayer optical filter in which a plurality of thin-film layers having different refractive indices are laminated in order to give detection sensitivity only to a wavelength region of the ultraviolet light to the filter. In Japanese Patent Application Laid-open 2016-111142, there is proposed application of an organic film filter which is configured to absorb ultraviolet light. Further, in Japanese Patent Application Laid-open 2008-251709, there is proposed an element that has sensitivity only to the wavelength region of the ultraviolet light by means of a differential characteristic of a light receiving element to which SiN layers that allow the ultraviolet light to transmit therethrough are laminated and a light receiving element to which SiN layers that do not allow the ultraviolet light to transmit therethrough are laminated.

However, unlike processes of manufacturing a normal semiconductor, processes of manufacturing the multilayer optical filter and processes of manufacturing the organic film filter require a great number of steps, and increase costs therefor. Further, in the case of the organic film filter, radiation of ultraviolet light having a short wavelength with strong energy for a long period of time may cause a compositional change. In addition, presence of films of different types on a photodiode may cause reflection and interference of light at the interface of the films, and thus a ripple may occur in output.

SUMMARY OF THE INVENTION

The present invention has been made to provide a semiconductor device including an ultraviolet light receiving element of a diode type which includes an insulating film resistant to ultraviolet light although the insulating film includes a single layer, and a method of manufacturing the semiconductor device.

In view of this, the following measures are employed in the present invention.

First, there is provided a semiconductor device including an ultraviolet light receiving element, the semiconductor device including: a first semiconductor light receiving element; and a second semiconductor light receiving element. In the semiconductor device, the first semiconductor light receiving element includes a first photodiode, and the second semiconductor light receiving element includes a second photodiode having the same structure as a structure of the first photodiode, the first photodiode including a PN junction formed of a first semiconductor region of a first conductivity which is formed in a semiconductor substrate, and a second semiconductor region of a second conductivity which is formed in the first semiconductor region of the first conductivity. In the semiconductor device, the first semiconductor light receiving element includes on the first photodiode a first insulating oxide film which has a film thickness of from 50 nm to 90 nm, and the second semiconductor light receiving element includes on the second photodiode a second insulating oxide film which has a film thickness that is 20 nm to 40 nm thinner than the film thickness of the first insulating oxide film.

Further, there is provided a method of manufacturing a semiconductor device including an ultraviolet light receiving element, the semiconductor device including: a first semiconductor light receiving element; and a second semiconductor light receiving element, the method including, in a region in which the first semiconductor light receiving element is to be formed and in a region in which the second semiconductor light receiving element is to be formed: forming a first semiconductor region of a first conductivity in a semiconductor substrate; forming a second semiconductor region of a second conductivity in the first semiconductor region of the first conductivity to form a first photodiode and a second photodiode, each of which includes a PN junction formed of the first semiconductor region of the first conductivity and the second semiconductor region of the second conductivity; forming, on the first photodiode of the first semiconductor light receiving element, a first insulating oxide film having a film thickness of from 50 nm to 90 nm; forming, on the second photodiode of the second semiconductor light receiving element, a second insulating oxide film having a film thickness that is 20 nm to 40 nm thinner than the film thickness of the first insulating oxide film; and forming a wire on the first insulating oxide film and the second insulating oxide film.

With use of the above-mentioned measures, it is possible to provide the semiconductor device including an ultraviolet light receiving element of a diode type which includes the insulating film resistant to ultraviolet light although the insulating film includes a single layer, and the method of manufacturing the semiconductor device.

DETAILED DESCRIPTION OF THE EMBODIMENTS

Now, embodiments of the present invention are described with reference to the accompanying drawings.

First Embodiment

Figure 1:
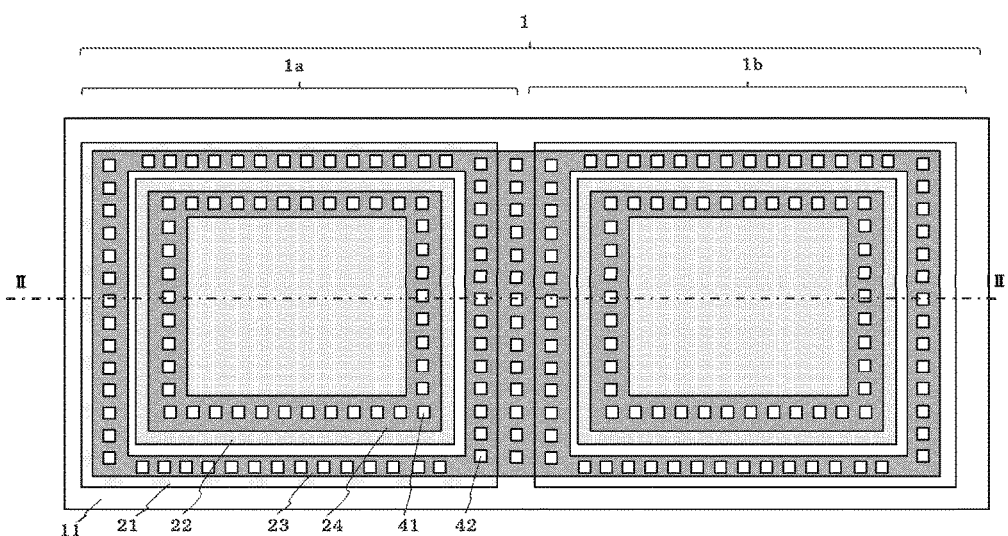
FIG. 1 is a plan view of a semiconductor device including an ultraviolet light receiving element according to a first embodiment of the present invention.
Figure 2:
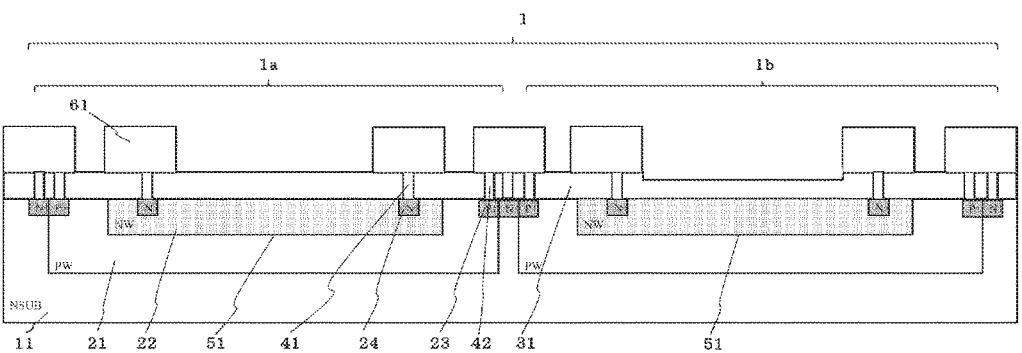
FIG. 2 is a sectional view of the semiconductor device including an ultraviolet light receiving element according to the first embodiment of the present invention.

FIG. 1 is a plan view of a semiconductor device including an ultraviolet light receiving element according to a first embodiment of the present invention, and FIG. 2 is a sectional view of the semiconductor device including an ultraviolet light receiving element according to the first embodiment. FIG. 2 is a sectional view taken along the line II-II of FIG. 1.

In FIG. 1, a semiconductor device 1 including an ultraviolet light receiving element includes a first semiconductor light receiving element 1a and a second semiconductor light receiving element 1b. The first semiconductor light receiving element 1a and the second semiconductor light receiving element 1b each include: a first P-type semiconductor region 21 which is formed in an N-type semiconductor substrate 11; a second N-type semiconductor layer region 22 which is formed in the first P-type semiconductor region 21; a P-type semiconductor region 23 having a high concentration which is formed in the first P-type semiconductor region 21; and an N-type semiconductor region 24 having a high concentration which is formed in the second N-type semiconductor layer region 22. On the semiconductor substrate 11, an insulating oxide film 31 is formed of, for example, a silicon oxide film.

A cathode electrode 41 which is formed in the insulating oxide film 31 is connected to the second N-type semiconductor layer region 22 via the N-type semiconductor region 24 having a high concentration. An anode electrode 42 which is formed in the insulating oxide film 31 is connected to the first P-type semiconductor region 21 via the P-type semiconductor region 23 having a high concentration. In addition, the anode electrode 42 is connected to the semiconductor substrate 11, and thus the first P-type semiconductor region 21 is connected to a ground terminal. Incidentally, in the first embodiment of the present invention, a junction depth of the first P-type semiconductor region 21 is 0.8 µm, and a junction depth of the second N-type semiconductor layer region 22 is 0.3 µm.

A photodiode 51 which is formed in each of the first semiconductor light receiving element 1a and the second semiconductor light receiving element 1b has a PN junction structure formed of the second N-type semiconductor layer region 22 and the first P-type semiconductor region 21. A bias is applied so that a potential of the cathode electrode 41 becomes higher than that of the anode electrode 42, and thus a depletion layer expands in the interface between the second N-type semiconductor layer region 22 and the first P-type semiconductor region 21. This depletion layer functions as an ultraviolet light sensing region for taking electric charges thereinto.

The first semiconductor light receiving element 1a and the second semiconductor light receiving element 1b have the same structure in the semiconductor substrate 11, but are different from each other in the insulating oxide films 31 formed on the semiconductor substrate 11. Specifically, in the first semiconductor light receiving element 1a, a thickness of the insulating oxide film 31 is set to from 90 nm to 50 nm. On the other hand, in the second semiconductor light receiving element 1b, the thickness of the insulating oxide film 31 is set so as to be 20 nm to 40 nm thinner than that of the first semiconductor light receiving element 1a.

When light enters the semiconductor light receiving element 1, a part of the incident light is absorbed by the insulating oxide film 31, and the remaining part thereof is reflected by the interface between the insulating oxide film 31 and the semiconductor substrate 11. As a result, the incident light reaches the semiconductor substrate 11 after being partially attenuated. Then, respective wavelength components of the incident light generate carriers in the semiconductor substrate 11 in accordance with light energy. The generated carriers are diffused in the semiconductor substrate 11. When the carriers reach the depletion layer region of the PN junction which is formed of the second N-type semiconductor layer region 22 and the first P-type semiconductor region 21, the carriers move to a terminal being the P-type semiconductor region 23 having a high concentration or a terminal being the N-type semiconductor region 24 having a high concentration by an electric field in the depletion layer to be output from a wire 61 as a voltage or a current. Carriers generated in a deep part of the semiconductor substrate 11 drift to a substrate without reaching the depletion layer region of the PN junction, and hence are not related to the output.

Figure 3:
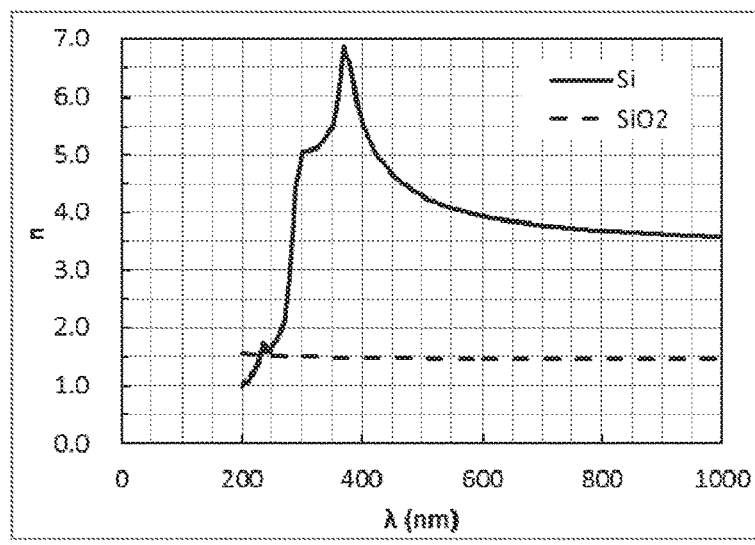
FIG. 3 is a graph for showing refractive indices n of a silicon substrate and a silicon oxide film with respect to each wavelength.
Figure 4:
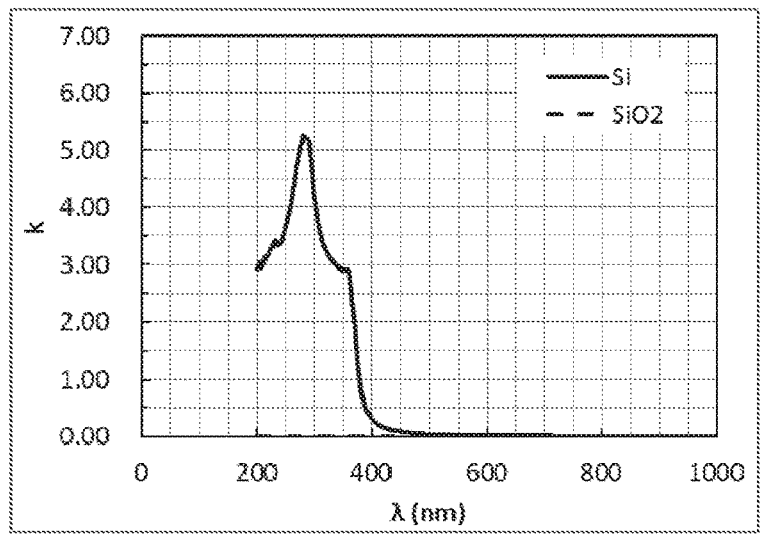
FIG. 4 is a graph for showing extinction coefficients k of the silicon substrate and the silicon oxide film with respect to each wavelength.
Figure 5:
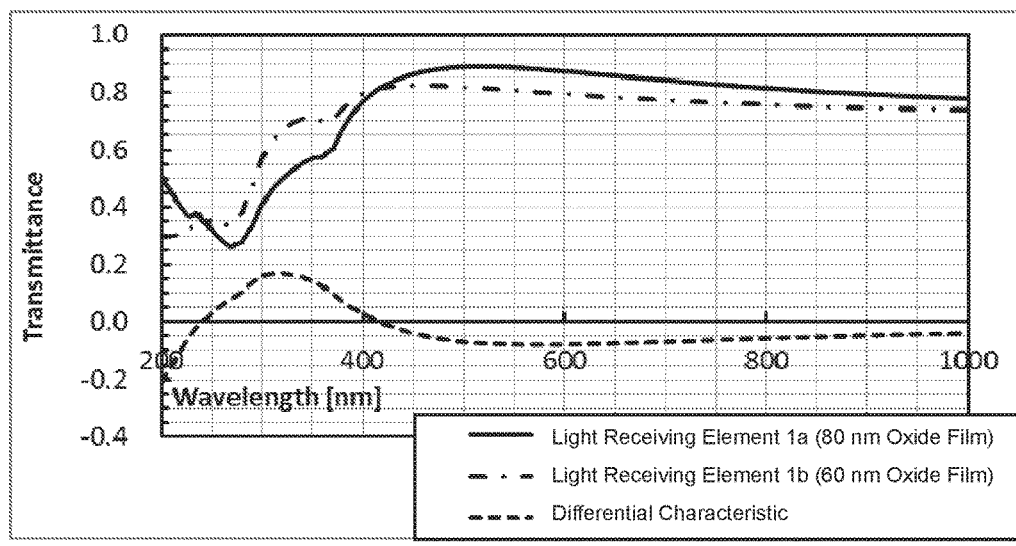
FIG. 5 is a graph for showing a transmittance of the semiconductor device including an ultraviolet light receiving element according to the first embodiment of the present invention.

In FIG. 3, refractive indices n of a silicon substrate and a silicon oxide film are shown. In FIG. 4, extinction coefficients k of the silicon substrate and the silicon oxide film are shown. In FIG. 5, there are shown wavelength dependences of the transmittances of light in the first semiconductor light receiving element 1a including the insulating oxide film 31 of 80 nm and the second semiconductor light receiving element 1b including the insulating oxide film 31 of 60 nm, and a differential characteristic of those wavelength dependences which are calculated from both the coefficients. The differential characteristic is a value obtained by subtracting the transmittance of the first semiconductor light receiving element 1a in which the insulating oxide film 31 is thick from the transmittance of the second semiconductor light receiving element 1b in which the insulating oxide film 31 is thin. The differential characteristic has a peak in the ultraviolet light wavelength region of from 250 nm to 400 nm. The actual output is a product of the transmittance and an internal quantum efficiency of generation of carriers by photons that reach the semiconductor substrate 11. However, the first semiconductor light receiving element 1a and the second semiconductor light receiving element 1b have the same structure of the photodiode of the PN junction, which means the first semiconductor light receiving element 1a and the second semiconductor light receiving element 1b have the same internal quantum efficiency, and are different from each other only in thicknesses of the insulating oxide films 31. Consequently, the difference in the transmittances thereof is directly reflected to the difference in output.

As shown in FIG. 5, the first semiconductor light receiving element 1a including the silicon oxide film of 80 nm as the insulating oxide film 31 hardly allows light having a wavelength of from 250 nm to 400 nm to transmit therethrough. The second semiconductor light receiving element 1b including, as the insulating oxide film 31, the silicon oxide film having a thickness 20 nm thinner than that of the first semiconductor light receiving element 1a easily allows light having a wavelength of from 250 nm to 400 nm to transmit therethrough as compared to the first semiconductor light receiving element 1a. Thus, by taking the difference between the first semiconductor light receiving element 1a and the second semiconductor light receiving element 1b, the characteristic of having sensitivity to specific light in the ultraviolet light region of from 250 nm to 400 nm is obtained. In a visible light band of 400 nm or more, the difference is almost constant.

Further, in this configuration, only the insulating oxide film 31 including a single layer is formed on the photodiode 51, and hence the semiconductor device 1 also has an effect of enabling an influence of light interference to be reduced. In addition, with the insulating oxide film 31 being the silicon oxide film which is a stable material, there may be obtained the semiconductor device 1 including an ultraviolet light receiving element which has a resistance to the ultraviolet light for a long period of time.

The same characteristics as the transmittances and the differential characteristic that are shown in FIG. 5 are obtained when the following conditions are satisfied. Specifically, the insulating oxide film 31 of the first semiconductor light receiving element 1a has a thickness of from 50 nm to 90 nm, and the insulating oxide film 31 of the second semiconductor light receiving element 1b which forms a pair with the first semiconductor light receiving element 1a has a thickness that falls within a range such that the thickness of the insulating oxide film 31 of the second semiconductor light receiving element 1b is 20 nm to 40 nm thinner than the thickness of the insulating oxide film 31 of the first semiconductor light receiving element 1a. More preferably, the insulating oxide film 31 of the first semiconductor light receiving element 1a has a thickness of from 60 nm to 80 nm, and the insulating oxide film 31 of the second semiconductor light receiving element 1b which forms a pair with the first semiconductor light receiving element 1a has a thickness that falls within a range such that the thickness of the insulating oxide film 31 of the second semiconductor light receiving element 1b is 20 nm to 40 nm thinner than the thickness of the insulating oxide film 31 of the first semiconductor light receiving element 1a.

The thickness of the insulating oxide film 31 of the first semiconductor light receiving element 1a is set to from 50 nm to 90 nm due to the following reasons. When the thickness of the insulating oxide film 31 of the first semiconductor light receiving element 1a is larger than 90 nm, the curved line for showing the transmittance in a visible light region does not become flat due to interference, and shows dependence on the film thickness, with the result that the above-mentioned constant differential characteristic in the visible light region cannot be obtained when the difference is taken between the insulating oxide film 31 of the first semiconductor light receiving element 1a and the insulating oxide film 31 of the second semiconductor light receiving element 1b which has a thickness 20 nm to 40 nm thinner than that of the first semiconductor light receiving element 1a. The thickness of the insulating oxide film 31 of the first semiconductor light receiving element 1a is set to 50 nm or more so that the difference can be taken between the insulating oxide film 31 of the first semiconductor light receiving element 1a and the insulating oxide film 31 of the second semiconductor light receiving element 1b.

In addition, the thickness of the insulating oxide film 31 of the second semiconductor light receiving element 1b is set so as to fall within the range such that the thickness of the insulating oxide film 31 of the second semiconductor light receiving element 1b is 20 nm to 40 nm thinner than the thickness of the insulating oxide film 31 of the first semiconductor light receiving element 1a so that the difference in a UV wavelength band is increased.

Next, a manufacturing method for obtaining the semiconductor device 1 including an ultraviolet light receiving element according to the first embodiment of the present invention is described.

First, the first P-type semiconductor region 21 is formed in the semiconductor substrate 11 by ion implantation and thermal diffusion treatment, and then the second N-type semiconductor layer region 22 is formed in the first P-type semiconductor region 21 by the same method. With this, the photodiode 51 having the PN junction between the first P-type semiconductor region 21 and the second N-type semiconductor layer region 22 is formed. Further, in a region in which the first semiconductor light receiving element 1a is to be formed, a relatively thick insulating oxide film 31 is formed, and in a region in which the second semiconductor light receiving element 1b is to be formed, a relatively thin insulating oxide film 31 is formed.

There are various methods for forming such insulating oxide films 31 that have different thicknesses. For example, first, an oxide film having a thickness of from 50 nm to 80 nm or less is formed on the semiconductor substrate of the first semiconductor light receiving element 1a and the second semiconductor light receiving element 1b, and then the insulating oxide film on the surface of the second semiconductor light receiving element 1b is removed by from 20 nm to 40 nm by etching. With this method, the insulating oxide films 31 that have different thicknesses may be formed. As the etching method, it is preferred to perform wet etching so that a high-quality insulating oxide film 31 with no residue of etching on its surface can be obtained. The step after the formation of the insulating oxide films 31 is a step of forming a wire, in which the wire 61 is required not to overlap with a light receiving region.

FIG. 2 is a sectional view of the semiconductor device 1 at a time when processing of reducing the thickness of the insulating oxide film 31 of the second semiconductor light receiving element 1b is performed after the step of forming the wire. In the insulating oxide film 31 under an end portion of the wire 61, a step is generated. In contrast, when the processing of reducing the thickness of the insulating oxide film 31 of the second semiconductor light receiving element 1b is performed before the step of forming the wire, the film thickness of the insulating oxide film 31 under the wire 61 can be made the same as a thickness of the insulating oxide film 31 in the light receiving region between the wires 61.

As a result, no step is generated, and hence influence of oblique light entering from the step can be suppressed.

After the step of forming the wire, a protective film that is, for example, a silicon nitride film, and covers the surfaces of the first semiconductor light receiving element 1a and the second semiconductor light receiving element 1b is formed. It is preferred that the protective film or other films be laminated only in a region other than a region right above the photodiode 51, that is, a region other than the light receiving region. There is no protective film on the surface of the insulating oxide film 31 right above the photodiode 51 so that the insulating oxide film 31 is exposed to the air.

Second Embodiment

Figure 6:
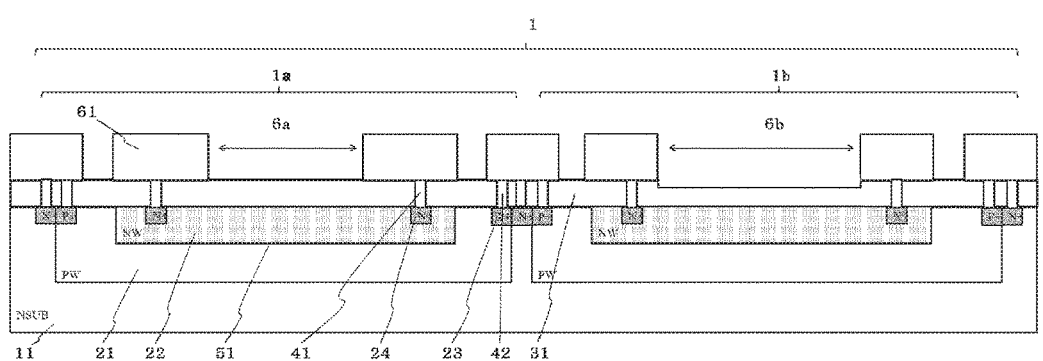
FIG. 6 is a sectional view of a semiconductor device including an ultraviolet light receiving element according to a second embodiment of the present invention.

FIG. 6 is a sectional view of a semiconductor device including an ultraviolet light receiving element according to a second embodiment of the present invention. In FIG. 5, the differential characteristic has the peak in the ultraviolet light wavelength region of from 250 nm to 400 nm. Meanwhile, the difference in the wavelength region other than the ultraviolet light wavelength region shows a negative characteristic value, which means the first semiconductor light receiving element 1a and the second semiconductor light receiving element 1b do not have the same characteristic. The second embodiment is made to solve this point.

In the first embodiment which is illustrated in FIG. 2 the light receiving regions of the first semiconductor light receiving element 1a and the second semiconductor light receiving element 1b have the same size. However, in the second embodiment which is illustrated in FIG. 6 a wire opening width 6a of the light receiving region of the first semiconductor light receiving element 1a and a wire opening width 6b of the light receiving region of the second semiconductor light receiving element 1b are set to have different sizes. With this, the light receiving regions of the first semiconductor light receiving element 1a and the second semiconductor light receiving element 1b have different sizes.

For example, when the difference in the wavelength region other than the ultraviolet light wavelength region is a negative characteristic value as shown in FIG. 5, the wire opening width 6a is set so as to be thinner than the wire opening width 6b, with the result that the size of the light receiving region of the first semiconductor light receiving element 1a becomes smaller than the size of the light receiving region of the second semiconductor light receiving element 1b. Consequently, the difference between the first semiconductor light receiving element 1a and the second semiconductor light receiving element 1b in the wavelength region other than the ultraviolet light wavelength region can be brought close to zero.

As described above, through adjustment of the sizes of the light receiving regions of the semiconductor light receiving elements, the transmittances of the semiconductor light receiving elements in the wavelength region other than the ultraviolet light wavelength region become equal to each other. As a result, it is possible to obtain only the differential characteristic in the intended ultraviolet light region.

Third Embodiment

Figure 7:
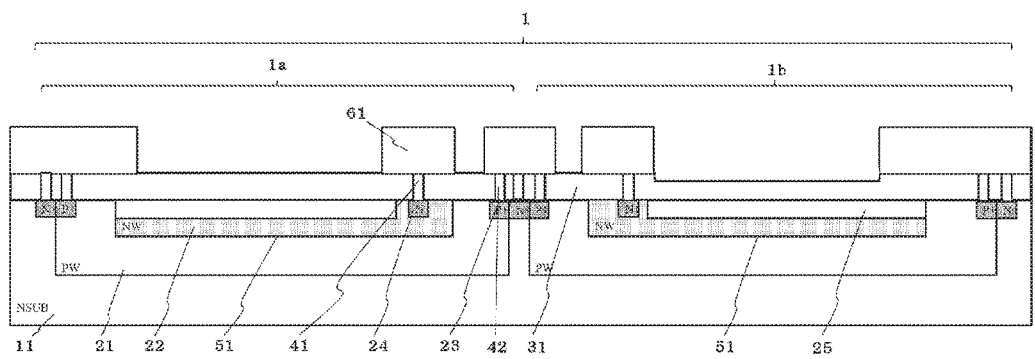
FIG. 7 is a sectional view of a semiconductor device including an ultraviolet light receiving element according to a third embodiment of the present invention.

FIG. 7 is a sectional view of a semiconductor device including an ultraviolet light receiving element according to a third embodiment of the present invention. Components that correspond to those of FIG. 2 are denoted by the same reference symbols. The third embodiment differs from the first embodiment which is illustrated in FIG. 2 in that a third P-type semiconductor region 25 is formed in the semiconductor substrate front surface on the second N-type semiconductor layer region 22 so that intake of carriers that are generated near the semiconductor substrate front surface is promoted.

In this configuration, the photodiode 51 has both the PN junction formed of the second N-type semiconductor layer region 22 and the first P-type semiconductor region 21 and a PN junction formed of the third P-type semiconductor region 25 and the second N-type semiconductor layer region 22. In the depletion layer near the former PN junction which is formed of the second N-type semiconductor layer region 22 and the first P-type semiconductor region 21, carriers due to an ultraviolet light that has a relatively long wavelength are captured. Meanwhile, in the depletion layer near the latter PN junction which is formed of the third P-type semiconductor region 25 and the second N-type semiconductor layer region 22, carriers due to an ultraviolet light that has a relatively short wavelength are captured. In this manner, the internal quantum efficiency of short-wavelength components that are absorbed near the semiconductor substrate front surface can be enhanced. The first semiconductor light receiving element 1a and the second semiconductor light receiving element 1b have the same structure in which the third P-type semiconductor region 25 is formed in the semiconductor substrate front surface on the second N-type semiconductor layer region 22.

Fourth Embodiment

Figure 8:
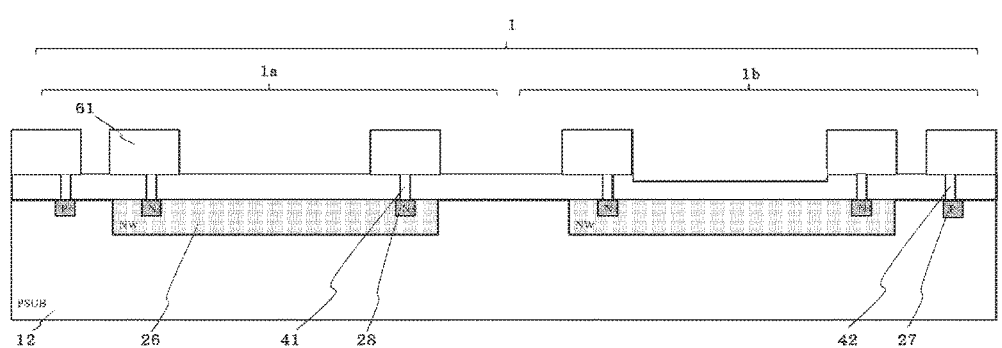
FIG. 8 is a sectional view of a semiconductor device including an ultraviolet light receiving element according to a fourth embodiment of the present invention.

FIG. 8 is a sectional view of a semiconductor device including an ultraviolet light receiving element according to a fourth embodiment of the present invention. The fourth embodiment differs from the first embodiment which is illustrated in FIG. 2 in that the first P-type semiconductor region 21 is not formed, and a P-type semiconductor substrate 12 is used to obtain a photodiode structure by a junction that is formed of the P-type semiconductor substrate 12 and a second N-type semiconductor layer region 26.

Fifth Embodiment

Figure 9:
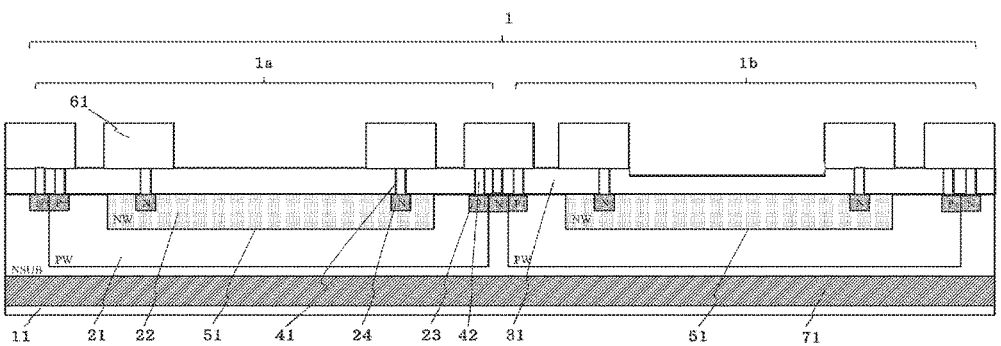
FIG. 9 is a sectional view of a semiconductor device including an ultraviolet light receiving element according to a fifth embodiment of the present invention.

FIG. 9 is a sectional view of a semiconductor device including an ultraviolet light receiving element according to a fifth embodiment of the present invention. Components that correspond to those of FIG. 2 are denoted by the same reference symbols. In FIG. 5, the differential characteristic has the peak in the ultraviolet light wavelength region of from 250 nm to 400 nm. At the same time, the difference in the wavelength region other than the ultraviolet light wavelength region shows a negative characteristic value, which means the first semiconductor light receiving element 1a and the second semiconductor light receiving element 1b do not necessarily have the same characteristic in the wavelength region other than the ultraviolet light wavelength region. The fifth embodiment is made to solve this point.

The fifth embodiment differs from the first embodiment which is illustrated in FIG. 2 in that a modified layer 71 is formed at a position near a back surface of the semiconductor substrate 11 which is a deep part of the semiconductor substrate 11. Light in the visible light region that has a wavelength of 400 nm or more reaches the deep part of the semiconductor substrate 11, and generates carriers at a deep position in the semiconductor substrate 11. Those carriers are diffused to be captured in the depletion layer, with the result that output in the visible light region is obtained. However, through formation of the modified layer 71 in the deep part, there are obtained semiconductor light receiving elements in which carriers are not generated in the visible light region but are generated in the ultraviolet light region. In FIG. 9, there is illustrated a structure in which the modified layer 71 is formed while being buried in the semiconductor substrate 11, but the modified layer 71 may be exposed on the back surface of the semiconductor substrate 11.

In the fifth embodiment, laser irradiation is employed as a method of forming the modified layer 71. A laser beam that has a transmittable wavelength with respect to a semiconductor wafer is radiated from a back surface thereof, and is condensed by an objective lens in optical system so as to focus inside the semiconductor wafer. A focal point is adjusted to a predetermined depth inside the semiconductor wafer, and thus the modified layer 71 is formed through multiphoton absorption. The semiconductor device 1 including an ultraviolet light receiving element of the present invention has a configuration in which the same modified layers 71 are formed in both of the region of the first semiconductor light receiving element 1a and the region of the second semiconductor light receiving element 1b so that the first semiconductor light receiving element 1a and the second semiconductor light receiving element 1b have the same structure in the semiconductor substrate 11.

When the modified layer 71 is to be formed in a large region as illustrated in FIG. 9, a laser beam may be scanned with respect to the entire surface of the semiconductor wafer. In a case where the depth in which the modified layer 71 is to be formed extends in a wide range, a plurality of focal points to be focused are provided in a depth direction of a region where the modified layer 71 is to be formed and a laser beam is scanned a plurality of times, a modified layer 71 that is thick in the depth direction is formed. In the semiconductor device 1 including an ultraviolet light receiving element of the fifth embodiment of the present invention, carriers that are generated at the deep position in the semiconductor substrate 11 are trapped by the modified layer 71, and annihilate after recombination. The internal quantum efficiency of long-wavelength components is decreased, and hence differential characteristic only to the ultraviolet light region can be selectively extracted.

The depth of the modified layer 71 is freely selected depending on a desired wavelength. For example, when differential characteristic only to light that has a wavelength of 400 nm or less is to be extracted, the depth of the modified layer 71 may be set to from 1 μm to 100 μm from the surface of the semiconductor wafer. This range of the depth has high absorption efficiency of light that has a wavelength of from 400 nm to 1,000 nm, and is thus effective for annihilation of carriers.

The modified layer 71 may be formed by ion implantation instead of the laser irradiation, but in this case, it is preferred that the modified layer 71 be formed, after the thickness of the semiconductor wafer is reduced by back grinding in advance, by performing ion implantation with high energy from the back surface of the semiconductor substrate. At this time, processing for recovering crystallinity of the modified layer 71, for example annealing after the ion implantation, is not required.

In addition, the modified layer 71 may be formed by back grinding instead of the laser irradiation. When back grinding is performed, a crushed layer is formed on the back surface of the semiconductor substrate. In normal processing, the crushed layer is ground with a fine grindstone and subjected to a chemical treatment so as to be removed, but when the back surface of the semiconductor substrate is ground with a coarse grindstone and cleaned, a thick crushed layer can be retained. This thick crushed layer contributes to annihilation by recombination of carriers that are generated by long-wavelength components.

What is claimed is:

1. A semiconductor device having an ultraviolet light receiving element, comprising:
    a semiconductor substrate;
    a first semiconductor light receiving element; and
    a second semiconductor light receiving element, adjacent to the first semiconductor light receiving element, the first semiconductor light receiving element having a first photodiode, and the second semiconductor light receiving element having a second photodiode which has a same structure the first photodiode,
    the first photodiode having a PN junction comprising a first semiconductor region of a first conductivity in the semiconductor substrate, and a second semiconductor region of a second conductivity in the first semiconductor region, and
    the first semiconductor light receiving element having a first insulating oxide film on the first photodiode, the first insulating oxide film having a total film thickness of from 50 nm to 90 nm, and
    the second semiconductor light receiving element having a second insulating oxide film on the second photodiode, the second insulating oxide film having a total film thickness that is 20 nm to 40 nm less than the film thickness of the first insulating oxide film.

2. The semiconductor device of claim 1, wherein a size of a first light receiving region of the first semiconductor light receiving element differs from a size of a second light receiving region of the second semiconductor light receiving element.

3. The semiconductor device of claim 2, wherein the size of the first light receiving region is smaller than the size of the second light receiving region.

4. The semiconductor device of claim 1, wherein each of the first semiconductor light receiving element and the second semiconductor light receiving element have a third semiconductor region of the first conductivity between the first semiconductor region and a front surface of the semiconductor substrate.

5. The semiconductor device of claim 2, wherein each of the first semiconductor light receiving element and the second semiconductor light receiving element has a third semiconductor region of the first conductivity between the first semiconductor region and a front surface of the semiconductor substrate.

6. The semiconductor device of claim 3, wherein each of the first semiconductor light receiving element and the second semiconductor light receiving element have a third semiconductor region of the first conductivity between the first semiconductor region and a front surface of the semiconductor substrate.

7. The semiconductor device of claim 1, further comprising a modified layer at a position nearer to a back surface of the semiconductor substrate than the PN junction of the first photodiode and the PN junction of the second photodiode.

8. The semiconductor device of claim 2, further comprising a modified layer at a position nearer to a back surface of the semiconductor substrate than the PN junction of the first photodiode and the PN junction of the second photodiode.

9. The semiconductor device of claim 3, further comprising a modified layer at a position nearer to a back surface of the semiconductor substrate than the PN junction of the first photodiode and the PN junction of the second photodiode.

10. The semiconductor device of claim 7, wherein the modified layer is exposed on the back surface of the semiconductor substrate.

11. The semiconductor device of claim 8, wherein the modified layer is exposed on the back surface of the semiconductor substrate.

12. The semiconductor device of claim 9, wherein the modified layer is exposed on the back surface of the semiconductor substrate.

13. A method of manufacturing a semiconductor device having an ultraviolet light receiving element,
the semiconductor device having:
a first semiconductor light receiving element; and
a second semiconductor light receiving element,
the method comprising, in a region for the first semiconductor light receiving element and in a region for the second semiconductor light receiving element:
forming a first semiconductor region of a first conductivity in a semiconductor substrate;
forming a second semiconductor region of a second conductivity in the first semiconductor region to form a first photodiode and a second photodiode, each of which includes a PN junction formed of the first semiconductor region and the second semiconductor region;
forming, on the first photodiode of the first semiconductor light receiving element, a first insulating oxide film having a film thickness of from 50 nm to 90 nm;
forming, on the second photodiode of the second semiconductor light receiving element, a second insulating oxide film having a film thickness that is smaller by from 20 nm to 40 nm than the film thickness of the first insulating oxide film; and
forming a wire on the first insulating oxide film and the second insulating oxide film.

14. The method of claim 13, wherein forming the wire includes forming a wire opening width of a light receiving region of the first semiconductor light receiving element and a wire opening width of a light receiving region of the second semiconductor light receiving element in different sizes.

15. The method of claim 13, further comprising forming, after forming the second semiconductor region, forming a third semiconductor region of the first conductivity between the second semiconductor region and a front surface of the semiconductor substrate.

16. The method of claim 14, further comprising, after forming the second semiconductor region in the first semiconductor region, a third semiconductor region of the first conductivity between the second semiconductor region and a front surface of the semiconductor substrate.

17. The method of 13, further comprising, after the forming the wire, forming a modified layer at a position nearer to a back surface of the semiconductor substrate than the PN junction of the first photodiode and the PN junction of the second photodiode.

18. The method of claim 14, further comprising, after the forming the wire, forming a modified layer at a position nearer to a back surface of the semiconductor substrate than the PN junction of the first photodiode and the PN junction of the second photodiode.

19. The method of claim 17, wherein forming the modified layer is carried out using a method involving radiating a laser beam that has a transmittable wavelength from the back surface of the semiconductor substrate and condensing the laser beam by an objective lens so that the laser beam focuses inside the semiconductor substrate.

20. The method of claim 17, wherein the forming the modified layer includes performing ion implantation from the back surface of the semiconductor substrate, the ion implantation unaccompanied by a crystallinity recovery process.

* * * * *